(12) United States Patent
Van Tran

(10) Patent No.: US 7,660,161 B2
(45) Date of Patent: Feb. 9, 2010

(54) INTEGRATED FLASH MEMORY SYSTEMS AND METHODS FOR LOAD COMPENSATION

(75) Inventor: Hieu Van Tran, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 359 days.

(21) Appl. No.: 11/655,901

(22) Filed: Jan. 19, 2007

(65) Prior Publication Data

US 2008/0175062 A1      Jul. 24, 2008

(51) Int. Cl.
*G11C 16/06* (2006.01)
(52) U.S. Cl. .............................. 365/185.21; 365/185.03; 365/205; 365/207; 365/210.11
(58) Field of Classification Search ................. 365/205, 365/207, 210.1, 210.11, 185.03, 185.21, 365/189.06
See application file for complete search history.

(56) References Cited

U.S. PATENT DOCUMENTS

| | | | | |
|---|---|---|---|---|
| 6,885,600 | B2 * | 4/2005 | Tran et al. .................... | 365/205 |
| 7,342,840 | B2 * | 3/2008 | Tran ............................ | 365/207 |
| 7,405,988 | B2 * | 7/2008 | Tran et al. .................... | 365/208 |
| 2006/0067120 | A1 * | 3/2006 | Drebinger ................. | 365/185.2 |
| 2008/0080235 | A1 * | 4/2008 | Tran ........................ | 365/185.03 |

* cited by examiner

*Primary Examiner*—Tuan T Nguyen
*Assistant Examiner*—Toan Le
(74) *Attorney, Agent, or Firm*—DLA Piper LLP (US)

(57) ABSTRACT

Systems and methods are disclosed including features that compensate for variations in the magnitude of supply voltages used in memory arrays. According to some aspects, compensation circuits may provide a tunable current-limiting load for data columns, where the load can be tuned to dynamically compensate for variations in supply voltage. In certain aspects, a compensation circuit may employ an operational amplifier configured as a voltage follower. The voltage follower compensates for any variations in supply voltage, forcing a constant voltage drop across the load element(s), thus maintaining a constant load. Other circuits may also be included, such as precharge circuits, clamp circuits, buffer circuits, trimming circuit, and sense amplifier circuits with sensed body effect. System-On-Chip integrated system aspects may include a microcontroller, a mixed IP, and a flash memory system having functionality and blocks that interface and interoperate with each other for load compensation.

65 Claims, 9 Drawing Sheets

INTEGRATED FLASH MEMORY SYSTEMS AND METHODS FOR LOAD COMPENSATION

BACKGROUND (1) Field

This invention relates generally to flash memory arrays that are used in integrated flash systems or system-on-chip (SOC) microcontroller flash systems. More specifically, this invention relates to load compensation in multilevel flash memory arrays.

(2) Description of Related Information

As information technology progresses at an unprecedented pace, the need for information storage increases proportionately. Accordingly, the non volatile information in stationary or portable communication demands higher capability and capacity storage. One approach to increasing the amount of storage is by decreasing physical dimensions of the stored bit (e.g., memory cell) to smaller dimensions such as nanocell technology. Another approach is to increase the storage density per bit. The second approach is known as digital multilevel nonvolatile storage technology. A sense amplifier reads the content of a memory cell by comparison to reference levels. As more bits are stored in a multilevel memory cell, the voltage separation of reference levels decreases.

Variations in many parameters, such as the magnitude of supply voltage VDD, can result in inaccurate data readings and other errors as voltage separation decreases and corresponding sensitivity to such variations increases. Accordingly, it is often desirable to develop systems and methods of compensating for these variations, so as to reduce fluctuations in the operating parameters of memory arrays and improve the accuracy with which data is written to, or read from, multilevel memory cells.

SUMMARY

The innovations herein can be implemented in numerous ways that overcome the above drawbacks by use of circuitry that compensates for variations in load or performs other load-related aspects to enable more accurate array operation.

A multilevel memory system consistent with aspects of the innovations herein may comprise a memory sensing circuit connected to the multilevel memory cell and having a voltage supply terminal, a load element connected between the voltage supply terminal and the multilevel memory cell, the load element providing a load for the memory sensing circuit, as a function of a voltage drop across at least a portion of the load element and a current through the load element, and a load compensation circuit connected to the load element and configured to maintain the load by compensating for a load variation of the load.

Another multilevel memory system consistent with aspects of the innovations herein may comprises a memory sensing circuit connected to the multilevel memory cell and configured to generate an output voltage signal corresponding to data stored in the multilevel memory cell, and a comparator circuit having a first transistor and a second transistor, the comparator circuit configured to compare the output voltage signal to a reference voltage signal according to a difference between a bulk gain of the first transistor and a bulk gain of the second transistor, the gain of the first transistor determined according to the reference voltage signal, and the gain of the second transistor determined according to the output voltage signal.

A system-on-chip controller memory system consistent with aspects of the innovations herein may comprise a microcontroller, a mixed signal IP suitable for interface with the microcontroller, a memory system with a sensing circuit connected to the memory cell and having a voltage supply terminal, a load element connected between the voltage supply terminal and the memory cell, the load element providing a load for the memory sensing circuit, the load provided according to a voltage drop across at least a portion of the load element, and a current through the load element, the load having a load variation, and a load compensation circuit connected to the load element and configured to maintain the load by compensating for the load variation.

Another system-on-chip controller memory system consistent with aspects of the innovations herein may comprise a microcontroller, a mixed signal IP, a memory system including a voltage supply terminal and a sensing circuit coupled to a memory cell, a load element connected between the voltage supply terminal and the memory cell, the load element connected to a bulk terminal of a transistor of the memory sensing circuit, and a load compensation circuit connected to the load element and configured to maintain the load by compensating for a load variation.

Other aspects and advantages of the invention will become apparent from the following detailed description and claims taken in conjunction with the accompanying drawings which illustrate, by way of example, the principles of the invention.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF EMBODIMENTS

In a first example, aspects of the present innovations relate to memory systems that compensate for variations in the magnitude of supply voltages used in multilevel memory arrays. Here, a compensation circuit provides a tunable current-limiting load for data columns, where the load can be tuned to dynamically compensate for variations in supply voltage. In some embodiments, a PMOS transistor acts as a current-limiting load, and the compensation circuit employs an operational amplifier configured as a voltage follower, for maintaining a specified voltage drop across the PMOS transistor. The voltage follower compensates for any variations in supply voltage, forcing a constant voltage drop across the PMOS, and thus maintaining a constant load despite any variations in supply voltage. The invention also encompasses the use of other circuits, such as precharge circuits for precharging lines like reference voltage lines, clamp circuits for maintaining a minimum voltage in data columns, buffer circuits decoupling noise from data signals, trimming circuit for trimming data signals, and comparator circuits operating according to the body effect of their component transistors.

Figure 1A:
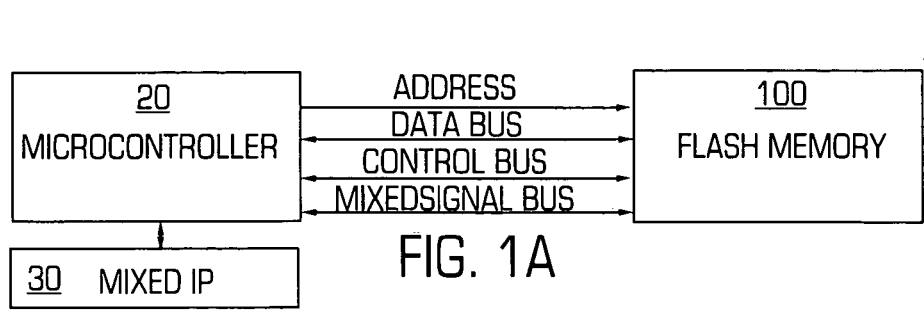
FIG. 1A is a block diagram illustrating one integrated system-on-chip (SOC) microcontroller memory system consistent with aspects of the present invention.

FIG. 1A is a block diagram illustrating an exemplary integrated system-on-chip (SOC) microcontroller memory system 10 consistent with one or more aspects related to the innovations here. The SOC controller memory system 10 includes a digital multilevel bit memory array system 100, a microcontroller 20, a mixed IP block 30 (i.e. a circuit or block of circuitry that may be devoted to a particularized application). System bus includes address, data, control, and mixed signal bus (that includes digital control, clock lines, power lines, and analog signal lines). The digital multilevel bit memory array system 100 will be described in details in FIG. 1B, served as a code and data storage for the system 10. The microcontroller 20 is such as an 8-bit microcontroller such as industry standard 8051, a RISC core, or a 32 bit ARM controller. The mixed IP such as 10-bit ADCs (Analog-to-Digital Converter) and/or 10-bit DACs (Digital-to-Analog Converter), XTAL (crystal oscillator), PLL (phase lock loop), voltage regulators, bandgap reference, Power-On-Reset (POR) circuit, VDD-detector (for power brown-out detection, detecting invalid VDD level to avoid invalid chip operation), etc. In one embodiment, the flash system 100 interfaces with the Mixed IP 30 such as using the ADC and DAC to generate high voltage program, erase, and sensing biases (such as described in U.S. Pat. No. 6,788,608 by Tran et al), and using clock signal for charge pumping and for program, erase, read, and IO burst algorithm control. In another embodiment, the microcontroller 20 provides security function for the flash system 100 (such as chip password protection, memory sector tag bit, user ID code, memory block or sector non-volatile or volatile protection) and error detection and correction (such as parity check, Hamming code, cyclic codes). In another embodiment, the microcontroller 20 and Mixed IP 30 uses the high voltage output (typically 10-20V) of the charge pump of the flash memory 100 for such as providing voltage overdrive for switches and big drivers to reduce impedance. In another embodiment, the microcontroller 20 and/or the memory system 100 uses the voltage regulator from the mixed IP 30 to provide regulated power supply for the microcontroller 20 and/or the memory system 100. In another embodiment, the microcontroller 20 and/or the memory system 100 uses the Power-On-Reset and/or VDD-detector from the mixed IP 30 to provide power on reset for the microcontroller 20 and/or the memory system 100. In another embodiment, the microcontroller 20 and/or the memory system 100 uses the VDD-detector from the mixed IP 30 to provide power supply level detection function for the microcontroller 20 and/or the memory system 100. In another embodiment, the memory system 100 provides its own POR and/or VDD-detector to the microcontroller 20 and/or the mixed IP 30.

Figure 1B:
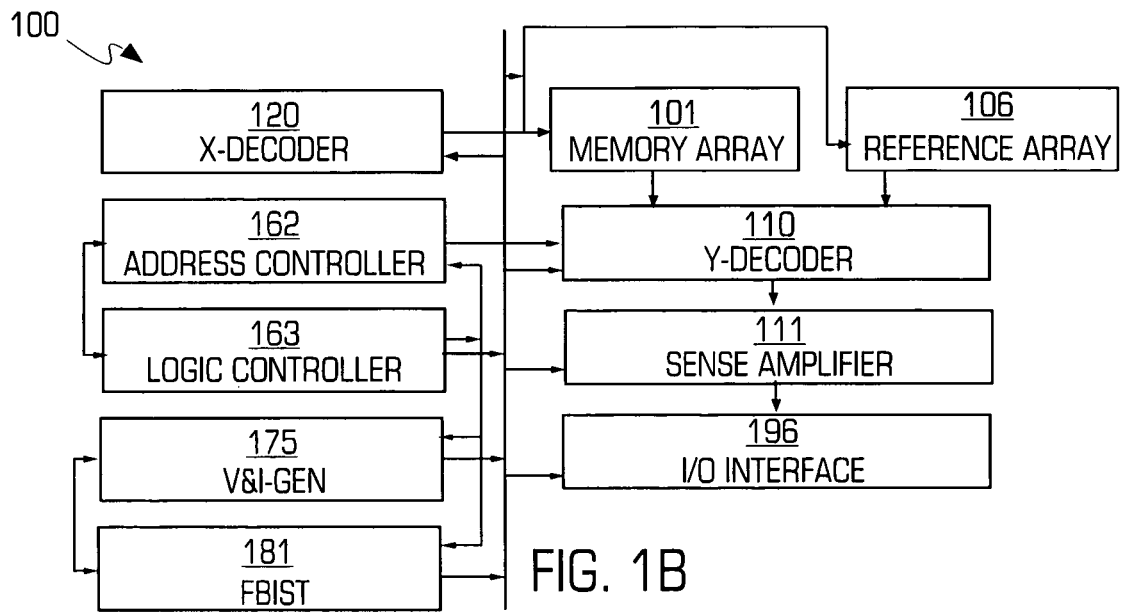
FIG. 1B is a block diagram illustrating a digital multilevel bit memory system consistent with aspects of the present invention.

FIG. 1B is a block diagram illustrating a exemplary digital multilevel bit memory array system 100 consistent with one or more aspects related to the present invention. The digital multilevel bit memory array system 100 of FIG. 1B is comprised of a memory array 101 that includes a plurality of memory cells (not shown) and a reference array 106 that includes a plurality of reference memory cells (not shown). An N bit digital multilevel cell is defined as a memory cell capable of storing the $2^N$ levels. The reference array 106 is used as a reference system of reference voltage levels to verify the contents of the memory array 101. In another embodiment, the memory array 101 may include reference memory cells for storing the reference voltage levels.

In one embodiment, the memory array 101 and the reference array 106 include a drain side injection flash technology, which uses lower power in hot electron programming, and efficient injector based Fowler-Nordheim tunneling erasure. The programming may be done by applying a high voltage on the drain of the memory cell, a bias voltage on the control gate of the memory cell, and a bias current on the source of the memory cell. The programming in effect places electrons on the floating gate of memory cell. The erase is done by applying a high voltage on the control gate of the memory cell and a low voltage on the drain and/or source of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the source (bitline) to a low bias voltage such as ground, and the voltage on the source is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the source (bitline) from a high voltage supply, and the voltage on the load is the readout voltage. In one embodiment, the array architecture and operating methods may be consistent with those disclosed in U.S. Pat. No. 6,282,145, entitled "Array Architecture and Operating Methods for Digital Multilevel Nonvolatile Memory Integrated Circuit System" by Tran et al., and/or U.S. Pat. No. 7,139,196, entitled "Sub-Volt Sensing For Digital Multilevel Memory" by Tran, which are incorporated herein by reference in their entirety.

The multilevel memory cells of the memory array 101 may be arranged in various ways, such as in rows and columns or in segments. Various addressing schemes may be used which organize the memory cells into bytes, pages or other arrangements.

The digital multilevel bit memory array system 100 further includes an x decoder 120, a y decoder 110, an address controller 162, a sense amplifier circuit 111, and an intelligent input/output interface 196. The y decoder 110 controls bitlines (not shown) coupled to columns in memory cells and the reference voltage cells, during a write, read (or verify), and erase operations. The sense amplifier 111 senses the read data which is provided to the I/O interface 196. The I/O interface 196 also buffers input into the memory array system 100. The sense amplifier 111 also senses the read data and verifies the read data against input data during memory programming or erasing.

In response to address and other control signals, the address controller 162 decodes the address signal and controls page, byte, segment or other addressing for the x decoder 120 and the y decoder 110. The x decoder 120 selects a row or a block of rows in the arrays 101 and 106 based on the signals from the address controller 162 and provides precise multi-level bias values over temperature, process, and power supply used for consistent single level or multilevel memory operation for the memory array 101.

The system 100 includes a logic controller 163 to control various chip functionality and to interface with the Mixed IP 30 and the Microcontroller 20.

The system 100 includes a voltage/current generator V&I-GEN 175 to generate biases for program, erase and read operation. The V&I-GEN 175 may interface with the Mixed IP 30 such as using the ADC,DAC for biases and pulse-shape generation and PLL and XTAL for clock sources.

The system 100 includes a flash built-in self test, FBIST 181, that is used to test on-chip non-volatile program and erase function, redundancy self repair, addressing uniqueness, defect open/short screening for bitline, wordline or sourceline, memory cell terminal leakage test (such as bitline, wordline or sourceline), power consumption test (standby or active), disturb screening, infant mortality screening, margin screening, at-speed test, etc.

The system 100 further includes power related circuits (not shown), such as band gap voltage generators, charge pumps, voltage regulators, and power management systems, and other control circuits (not shown) such as voltage algorithm controllers.

The system 100 may execute various operations on the memory array 101. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, consistent with the operations described in U.S. Pat. No. 6,282,145, incorporated herein by reference above.

Figure 2:
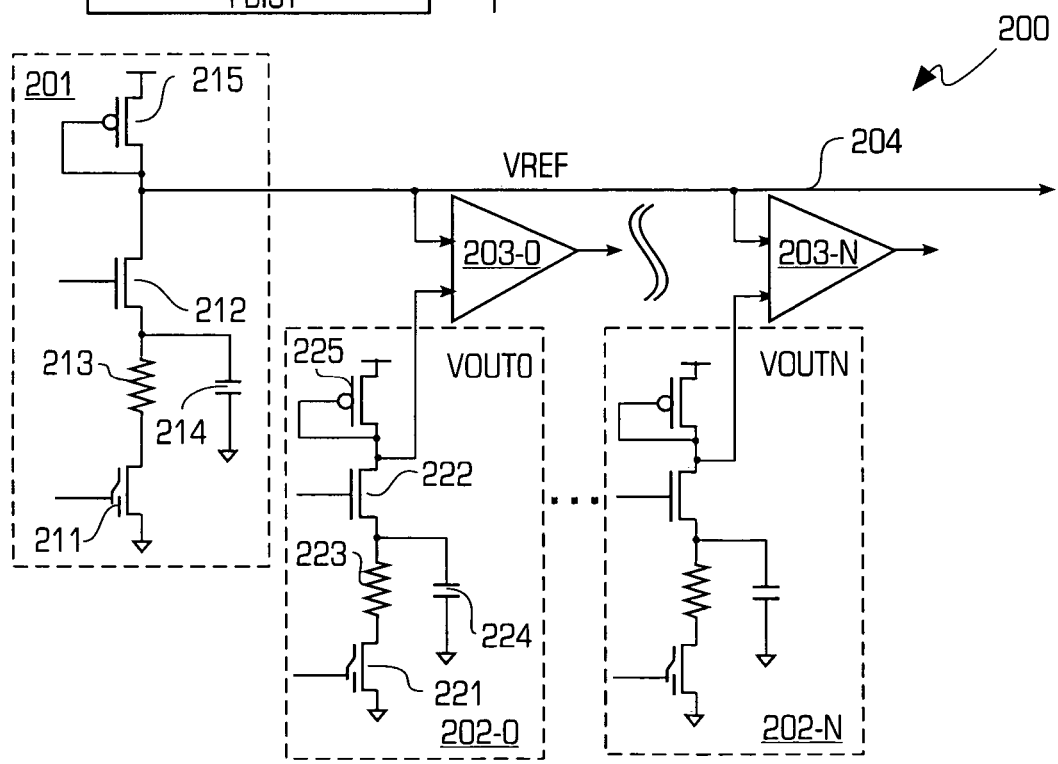
FIG. 2 is a schematic diagram illustrating a conventional sensing system consistent with aspects of the present invention.

FIG. 2 is a schematic diagram illustrating a conventional sensing system 200. The conventional sensing system 200 comprises a reference column 201, a plurality of data columns 202-0 through 202-N, and a plurality of comparators 203-0 through 203-N. The reference column 201 comprises a reference memory cell 211, an NMOS transistor 212 and a PMOS transistor 215. A bitline resistor 213 is shown to indicate resistance on the bitline. A bitline capacitor 214 is shown to indicate capacitance on the bitline. The reference column 201 provides a voltage reference on the reference line 204 which is applied to a first input of each of the comparators 203-0 through 203-N. Each data column 202 comprises a data memory cell 221, an NMOS transistor 222 and a PMOS transistor 225. A bitline resistor 223 is shown to indicate resistance on the bitline. A bitline capacitor 224 is shown to indicate capacitance on the bitline. Each of the data columns 202-0 through 202-N provides a data output voltage to a second input of a respective comparator 203-0 through 203-N so that the comparator 203 provides an output indicative of the stored data in the corresponding data column 202.

The conventional sensing system 200 has mismatches within the system because of differences in the PMOS transistors 215 and 225 (such as threshold voltage or transconductance beta) that provide loads for the respective reference column 201 and the data column 202. Further, mismatches can occur due to variations in VDD lines, such as voltage drops across VDD lines due to the resistance of these lines. Even further, the comparators 203 have a mismatch in their inputs. These mismatches may lead to inaccurate reads of the data cells 221. Moreover, the bitlines may have a mismatch in capacitances that may lead to inaccurate reads, especially in dynamic reads. Other mismatches may come from layout, such as voltage drop along power lines or interconnect lines.

The mismatches may cause a difference dVo in voltage between outputs of the load transistors 215 and 225 due to the PMOS transistors mismatch of the threshold voltage VT, beta mismatch, or voltage drop mismatch, such as VDD, bias current Ibias, or voltage bias Vbias. The difference voltage dVo is typically between 20 and 50 millivolts, but can be higher, e.g., a few hundred millivolts for current large chips.

Figure 3A:
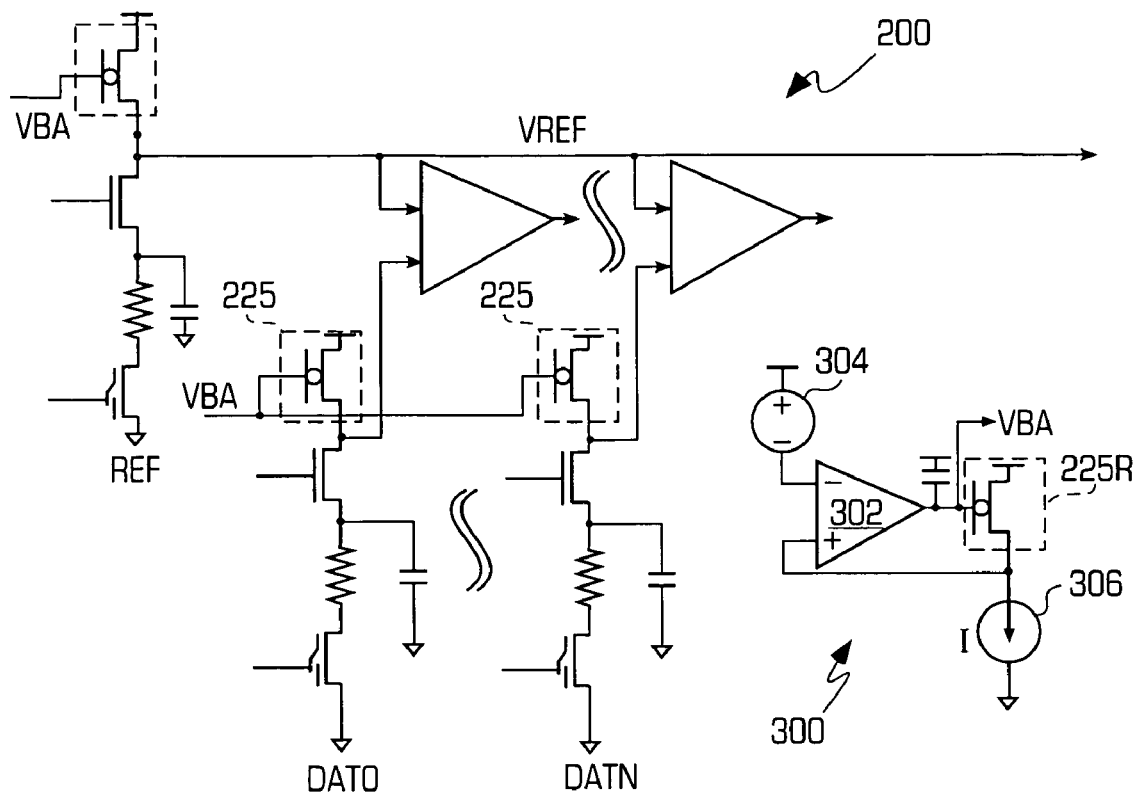
FIGS. 3A-3F are schematic diagrams illustrating various supply voltage compensation circuits configured in accordance with aspects of the present invention.

One aspect of the present invention involves compensation for these mismatches, especially those that can occur due to variations and/or fluctuations in the PMOS transistors 215, 225, and in the supply voltage VDD. To that end, the sense amplifier 111 (FIG. 1) may include the sensing systems and subsystems of FIGS. 3-4. FIG. 3A illustrates one example of a supply voltage compensation circuit configured in accordance with the present invention. In contrast with conventional systems that include only a diode connected PMOS transistor 225 providing a load, a compensation circuit 300 is provided, to compensate for variations in the load that the PMOS transistor 225 provides. The compensation circuit 300 includes an operational amplifier 302, a voltage source 304, and a current source 306. The current source 306 is set up to pass a specified amount of current through the PMOS transistor 225R (tuned element/transistor or reference element/transistor). The transistors PMOS 225 are tuned to the transistor PMOS 225R, meaning its gate voltage is biased to be the same as that of the transistor PMOS 225 and its size is of a predetermined ratio, e.g. 2:1, to that of the transistor PMOS 225R. The operational amplifier 302 is connected at its output terminal tuning node VBA to the gate terminal of PMOS transistor 225R, while its inverting terminal ("−") is connected to voltage source 304 and its noninverting terminal ("+") is connected to the drain terminal of the PMOS transistor 225R. It can thus be seen that the operational amplifier 302 acts as a voltage follower, maintaining a voltage drop across the drain terminal and the source terminal of the PMOS transistor 225R according to the voltage supplied to its inverting terminal by the voltage source 304.

As the drain-source voltage is fixed by the operational amplifier 302, and the current through the PMOS transistor 225R (hence the PMOS transistor 225) is fixed by the current source 306, the compensation circuit 300 sets the "effective resistance," or load, provided by the PMOS transistor 225 at a predetermined value equal to the drain-source voltage divided by the current from the current source 306. That is, the compensation circuit 300 maintains a constant load, eliminating load variations by maintaining a constant drain-source voltage across the PMOS transistor 225 and a constant current through the same PMOS transistor 225. More specifically, by acting as a voltage follower, the compensation circuit 300 compensates for fluctuations in VDD or other properties that cause load variations such as process or temperature variation, maintaining a constant voltage drop across the load element even when VDD varies.

Figure 3B:
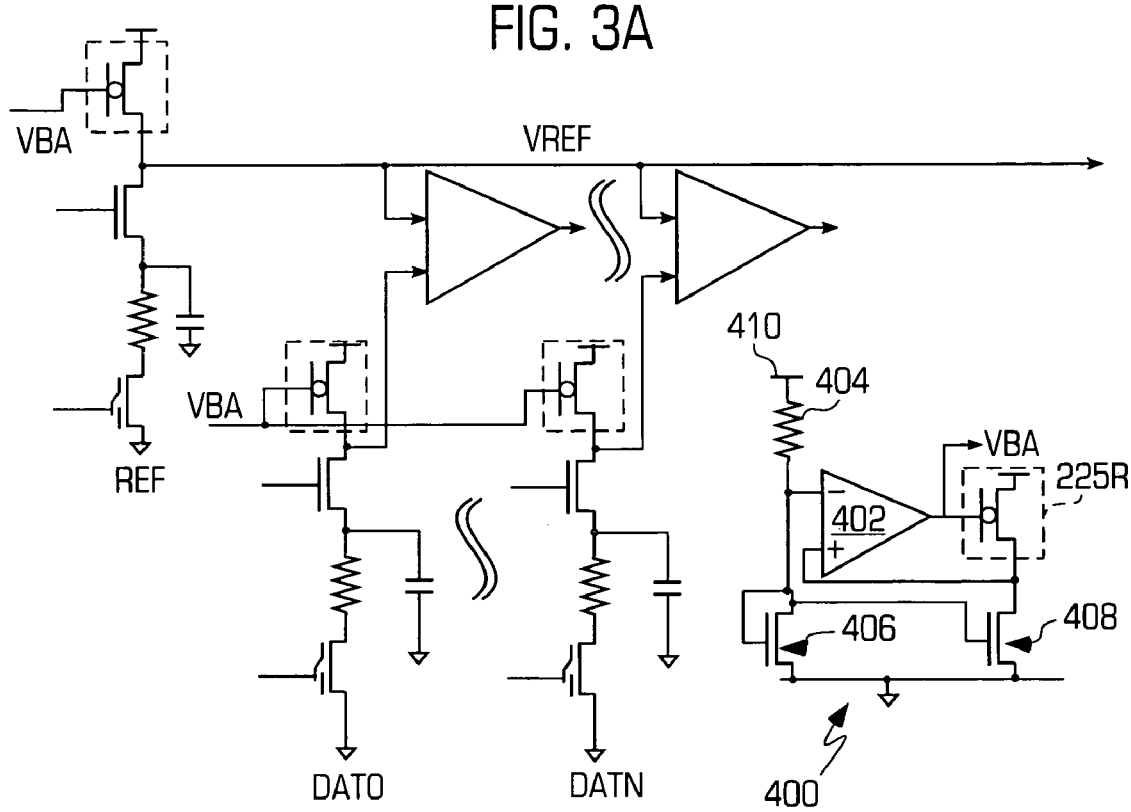

This same result can also be achieved by other circuit configurations, of the invention. FIG. 3B illustrates another example of a supply voltage compensation circuit configured in accordance with the present invention. Here, compensation circuit 400 includes an operational amplifier 402 with its output tuning node VBA electrically connected to the gate terminal of PMOS transistor 225R, its inverting terminal connected to resistor 404 which is in turn connected to a voltage source 410, and its noninverting terminal connected to the drain of PMOS transistor 225R. The noninverting and inverting terminals are also electrically connected to transistors 406 and 408 respectively, which are configured as a current mirror, for example current in transistor 408 is fixed at a mirror ratio, e.g., 2:1 or 1:1, to current in transistor 406. In operation, the operational amplifier 402 functions as a voltage follower, maintaining a constant drain-source voltage in the PMOS transistor 225R according to the voltage at the "–" terminal of operational amplifier 402. This voltage is, in turn, determined according to the magnitudes of the drain voltage and the resistance of the resistor 404. The current through this resistor 404 is mirrored through the PMOS transistor 225R by the current mirror (i.e., transistors 406, 408). Accordingly, it can be seen that the compensation circuit 400 produces a predetermined, constant load according to a specified voltage drop across PMOS 225R and PMOS 225 and a specified current through PMOS 225R and PMOS 225, by simply selecting an appropriate voltage level at terminal 410 and an appropriate resistance value for the resistor 404.

Figure 3C:
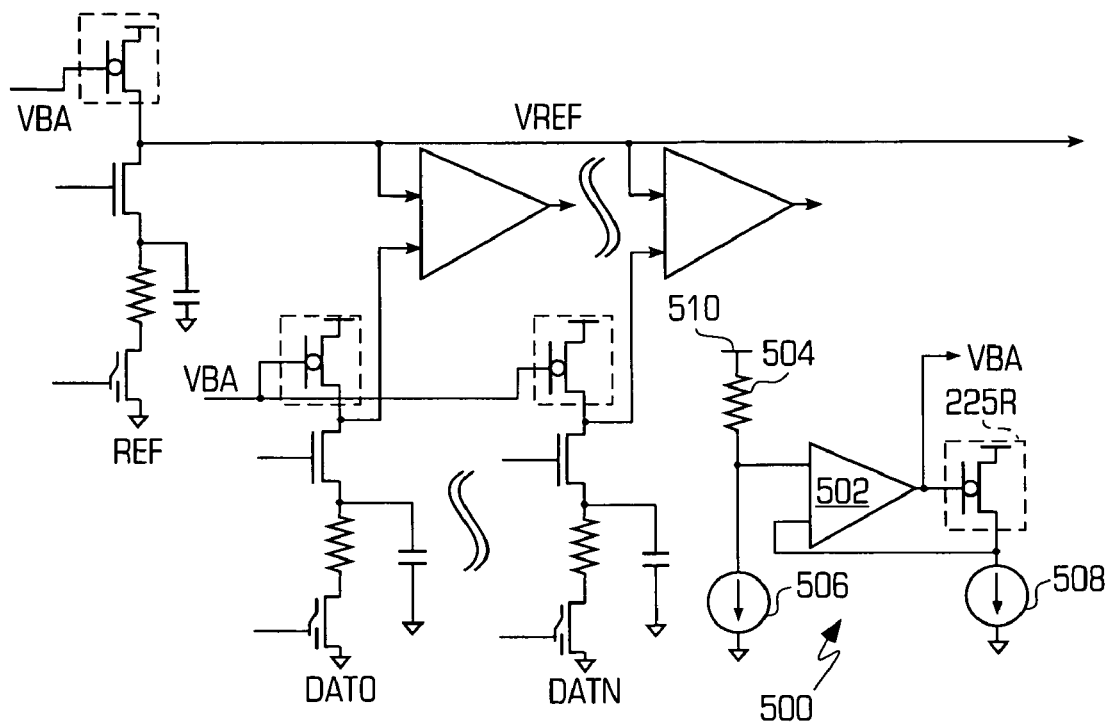

FIG. 3C illustrates yet another example of a supply voltage compensation circuit. The compensation circuit 500 includes an operational amplifier 502 with its output tuning node VBA electrically connected to the gate terminal of PMOS transistor 225R and transistor PMOS 225, its inverting terminal connected to resistor 504 which is in turn connected to a voltage source 510, and its noninverting terminal connected to the drain of PMOS transistor 225. The inverting and noninverting terminals are also electrically connected to current sources 506, 508, which function similarly to the current mirror with a mirror ratio M:N of FIG. 3B, specifying a fixed amount of current that flows through the resistor 504 and PMOS 225R (and hence PMOS 225). This in turn specifies the voltage drop across PMOS 225R. In this manner, the compensation circuit 500 produces a constant load for the PMOS 225, by specifying a current through the PMOS 225 and by maintaining a constant voltage drop across PMOS 225 according to the voltage at the inverting terminal of the operational amplifier 502 (which is determined by the voltage at the voltage source terminal 510, the resistance of resistor 504, and the current source 506).

While the above described compensation circuits are discussed in the context of their ability to compensate for changes in VDD voltage, one of ordinary skill in the art will realize that the compensation circuits of the invention can compensate for changes in many different properties of memory cell circuitry. For example, in addition to the above described ability to compensate for changes in VDD voltage, the above circuits maintain a constant voltage drop across the load element PMOS 225, which can compensate for factors such as load changes due to temperature variations in PMOS 225 that alter its electrical properties. The compensation circuits can also compensate for load variations caused by variations in the fabrication of the load elements, resulting from slightly differing device dimensions and properties. By forcing a constant voltage drop despite these variations, the compensation circuits of the invention can correct for any variations in load, maintaining the voltage drop across the load element(s) at a predetermined value, thus maintaining the load on the data column 202 at a predetermined value.

Figure 3D:
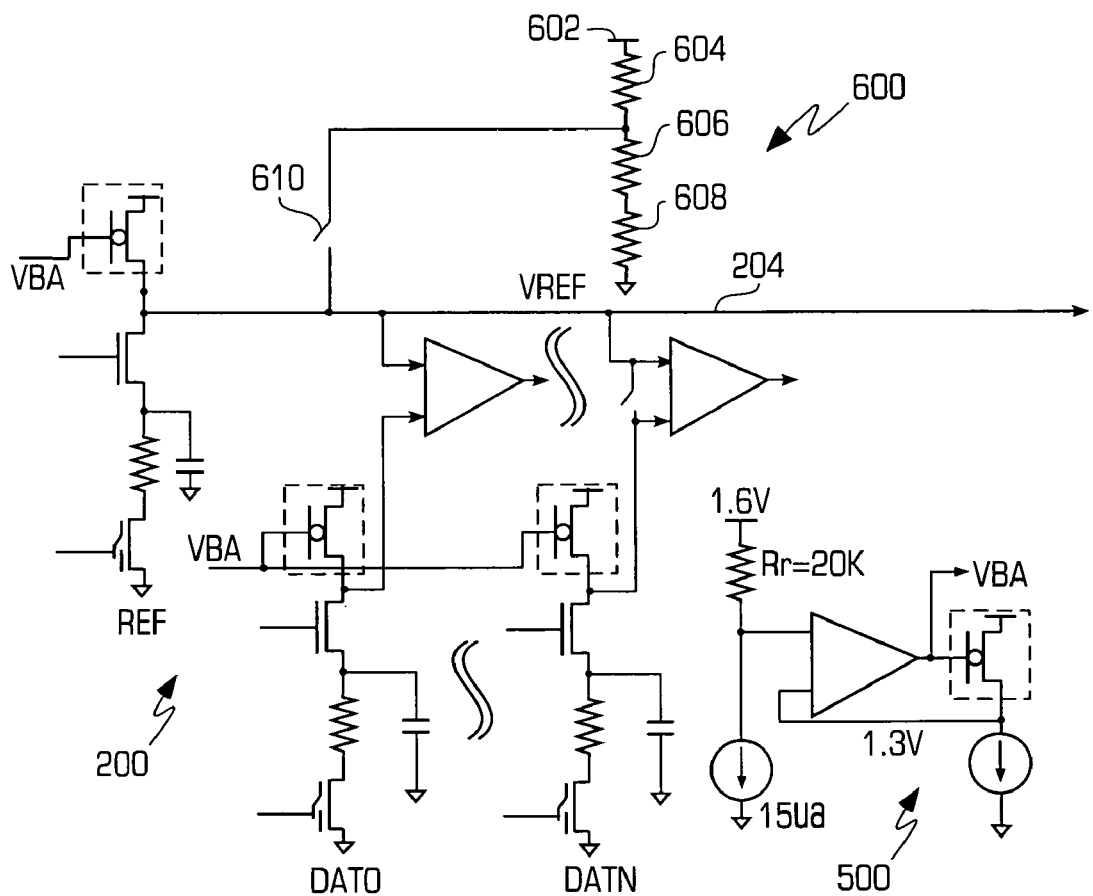

The innovations herein also include the use of other circuits besides the supply voltage compensation circuits described above. For instance, the invention includes the use of a precharge circuit, for precharging voltage lines and thereby reducing settle times in data storage and retrieval. FIG. 3D illustrates one example of a precharge circuit consistent with one or more aspects of the current invention. A precharge circuit 600 includes a voltage source terminal 602 and resistors 604-608. The resistors 604-608 are connected in series between the voltage source terminal 602 and a ground terminal, with the node between resistors 604 and 606 also connected to VREF line 204 through switch 610. In operation, when switch 610 is closed, a voltage can be applied at the voltage source terminal 602 to transmit a charge to VREF line 204, helping to precharge the line 204. This allows the VREF line 204 to reach its desired voltage levels faster, thus reducing settle times and read/write times. When a precharge is not needed, switch 610 can be opened to prevent the circuit 600 from precharging the VREF line 204. Here, as the resistors 604, 606 are configured as a voltage divider, it can be recognized that the voltage at the node between resistors 604 and 606 depends on the ratio of the resistance of resistor 604 to that of resistor 606. Accordingly, the magnitude of the precharge, and the speed at which it can be applied to VREF line 204, can be adjusted according to the ratio of resistances of resistors 604 and 606. Also shown are switches across terminals of comparators to be closed during precharging.

Figure 3E:
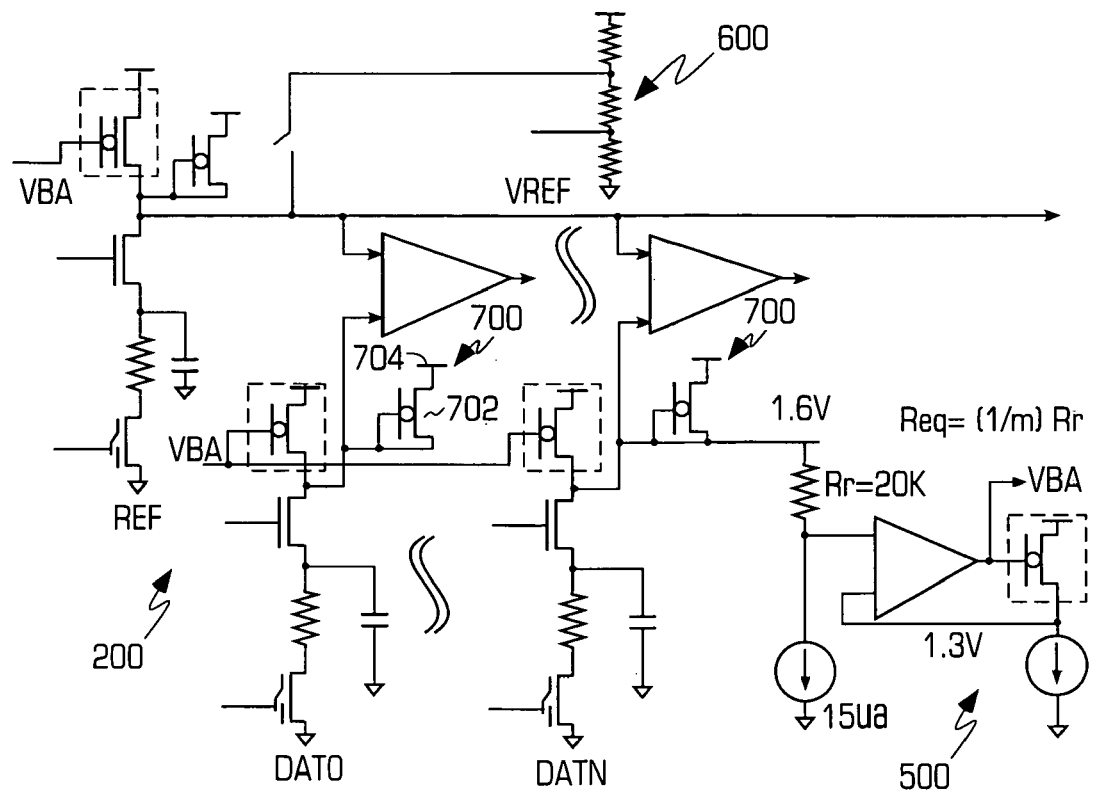
Figure 3F:
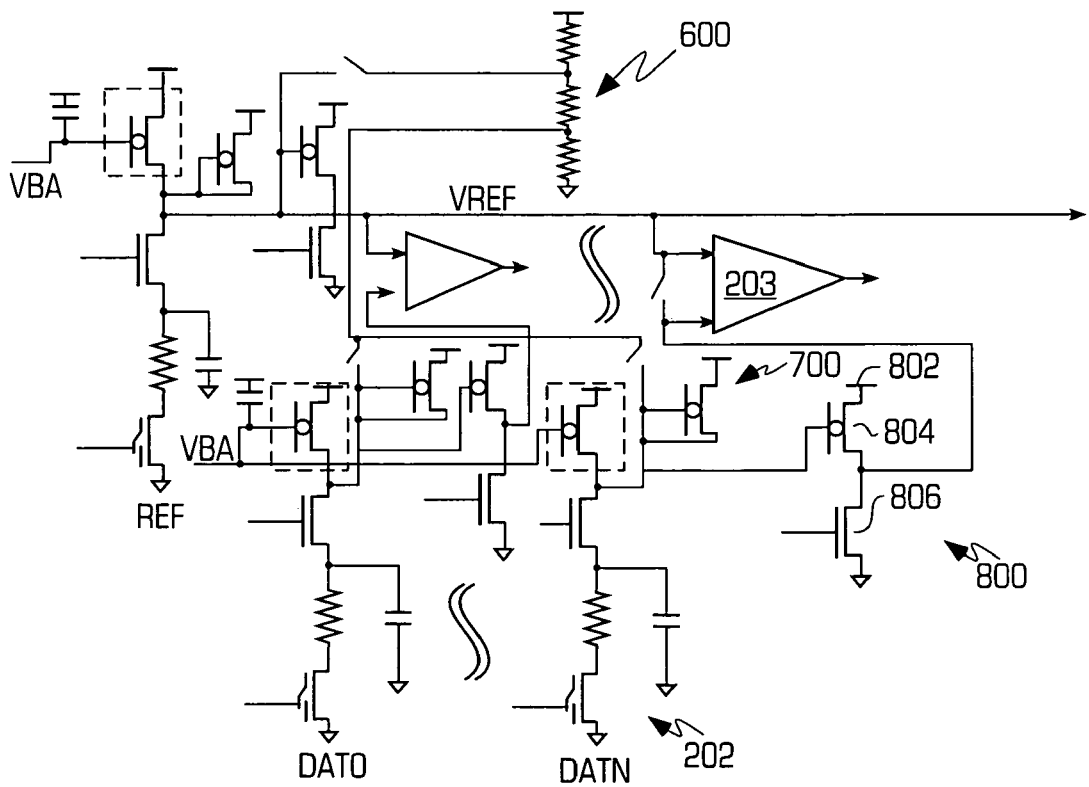

In addition to precharge circuits, the innovations herein include the use of clamp circuits for maintaining minimum voltages within data columns 202. FIG. 3E illustrates one example of a clamp circuit consistent with one or more aspects of the invention. Here, clamp circuits 700 have a PMOS transistor 702 with a source terminal connected to a voltage source terminal 704, and gate and drain terminals connected to the VOUT of data columns 202. In operation then, the PMOS transistor 702 is kept in the on state by the voltage from the voltage source terminal 704, thus maintaining a minimum voltage at the VOUT terminals and keeping data column voltages from falling to zero. The maintaining of such minimum voltages is often desirable, as zero voltages within data columns 202 can often result in excessive time taken between read/write operations, as data column voltages must then be boosted back up before a read operation can commence.

The innovations also include the use of buffer circuits for decoupling noise and loading from the comparators 203. In this embodiment, a buffer circuit 800 includes a voltage source terminal 802, a native NMOS transistor 804, and an additional transistor 806. The native NMOS 804 has its drain connected to the voltage source terminal 802, its gate connected to VOUT, and its source connected to the drain of the additional transistor 806. The transistor 806 also has a grounded source terminal. In operation then, the VOUT signal is applied to the gate of the native NMOS 804 so as to pass a corresponding signal from the voltage source terminal 802 to the comparator, this corresponding signal indicative of data stored in the data column 202. However, noise (and the loading) from the comparators 203 is blocked by the NMOS 804, and is not seen at the data column 202. Thus, the buffer circuit 800 allows data signals out to the comparator 203, while effectively blocking noise back from the comparator 203 to the data column 202.

Figure 3G:
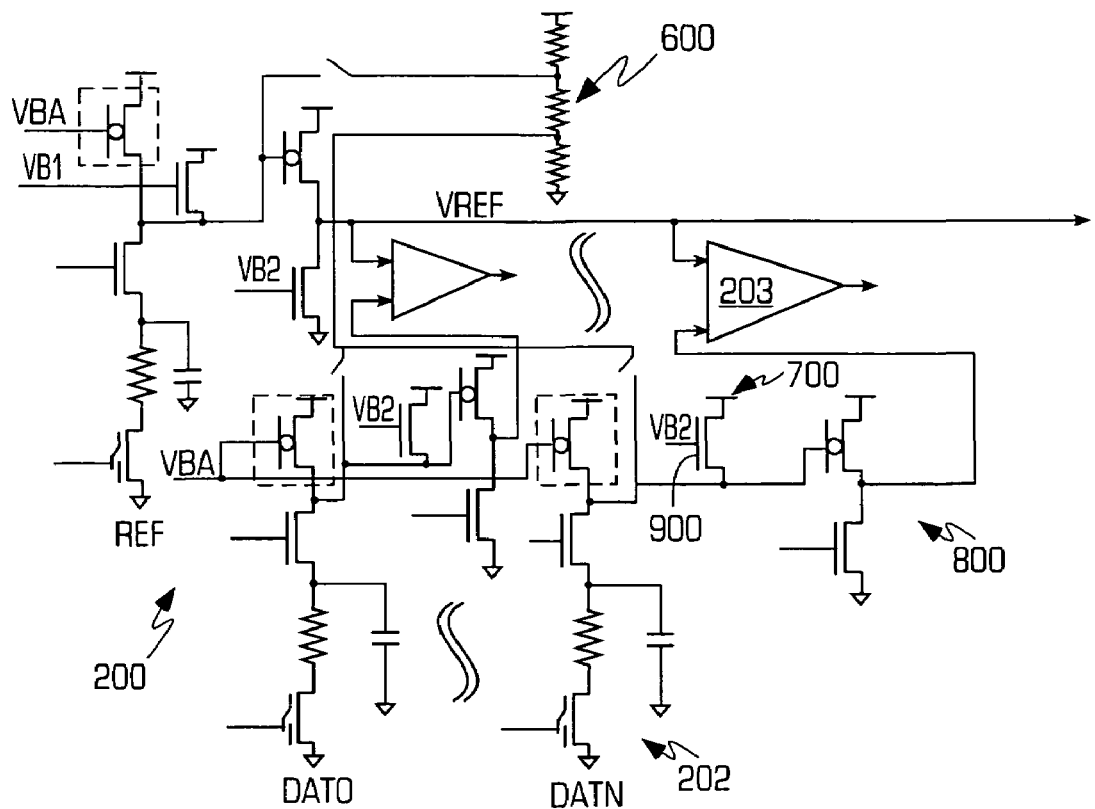
FIG. 3G is a schematic diagram illustrating a precharge circuit configured in accordance with aspects of the present invention.

It should be noted that the invention is not limited to the use of precharge, clamp, or buffer circuits in isolation. Rather, the invention encompasses the use of any or all of these circuits, in any combination. As one example, FIG. 3G illustrates the use of a precharge circuit 600, clamp circuit 700, and buffer circuit 800 simultaneously. It should also be noted that the invention is not limited to the use of the components described above, but rather encompasses the use of any suitable devices or components. For example, the clamp circuit 700 need not be specifically limited to the use of a PMOS 702, but rather can employ an NMOS transistor 900, as shown in FIG. 3G. While one of ordinary skill in the art will realize that the various different components are desirable for different applications, it can be noted here that the NMOS transistor 900 can be used in place of the PMOS 702 when, for instance, it is desirable to allow the voltage VB2, applied at the gate of NMOS 900, to vary by a greater amount than would the voltage VB2 applied at the gate of PMOS 702.

Figure 3H:
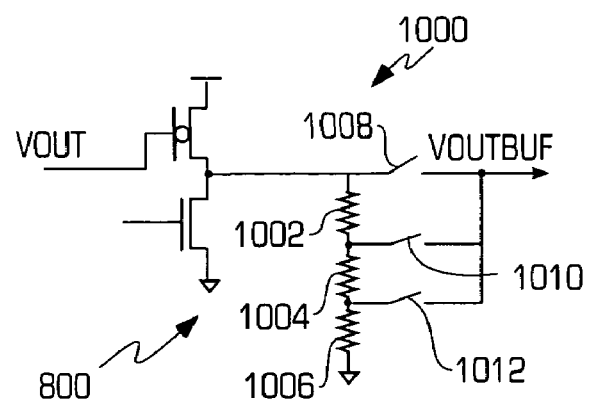
FIGS. 3H-3K illustrate buffer circuits configured in accordance with aspects of the present invention.

The innovations also include the use of trimming circuits for trimming the voltage signal out from the data columns 202 to the comparators 203. This trimming is often desirable in allowing room for offsets, margin testing (margin refers to an operating range within which a cell voltage or current belongs to), and the like. FIGS. 3H-3K are various illustrative embodiments of trimming circuits constructed in accordance with the invention. In FIG. 3H, a trimming circuit 1000 includes three resistors 1002-1006 connected in series, with the first resistor 1002 connected between the output of buffer circuit 800 (i.e., the data signal to comparators 203) and second resistor 1004, the second resistor 1004 connected between first resistor 1002 and third resistor 1006, and third resistor 1006 connected between second resistor 1004 and a ground terminal. When switch 1008 is closed and switches 1010, 1012 are open, the resistors 1002-1006 sink current, dropping the voltage of the data signal to comparators 203. Various ones of the switches 1008-1012 can be opened, and the remainder closed, so as to drop the voltage out to the comparators 203 to various desired levels. This allows any desired amount of trimming to be applied to the signal out from the data columns 202 to the comparators 203, for any desired offset or other application such as margin testing.

It is noted that while FIG. 3H illustrates a trimming circuit 1000 employed in conjunction with a buffer circuit 800, the trimming circuits of the invention need not necessarily be so used. Rather, the trimming circuits of the invention can be used in conjunction with any, all, or none of the precharge circuit 600, clamp circuit 700, and buffer circuit 800.

Figure 3I:
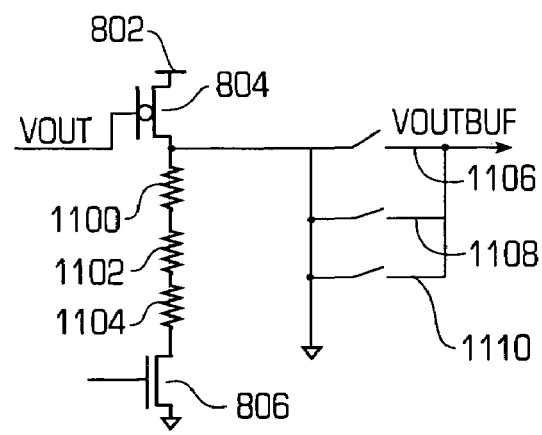

It is also noted that the invention is not limited to the trimming circuits shown in FIG. 3H, but rather encompasses any circuit for trimming the output voltage of a data column 202. FIG. 3I illustrates one such alternative trimming circuit, where the trimming circuit is incorporated into a buffer circuit. Here, buffer transistor 804 is connected between voltage terminal 802 and resistors 1100-1104, which are connected in series similar to resistors 1002-1006. Here, the resistors 1100-1104 are connected between the source of NMOS 804, at one end, and transistor 806, at the other end. Even though the resistors 1100-1104 are incorporated within buffer circuit 800, it can be seen that the resistors 1100-1104 sink current hence causing a voltage drop across them, trimming the voltage at the source of NMOS 804, and further trimming the voltage at each successive output 1106-1110.

Figure 3J:
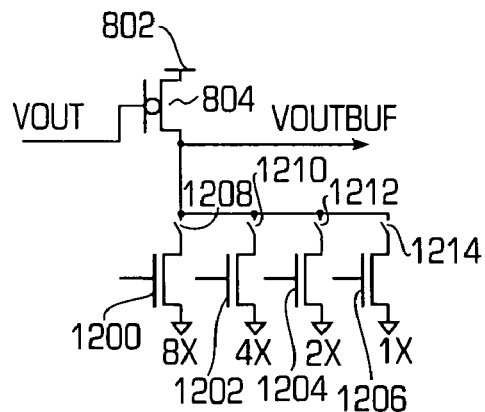

FIG. 3J illustrates another alternative trimming circuit consistent with one or more aspects of the present innovations. Here, a voltage terminal 802 and buffer transistor 804 provide buffering as described above. Additionally, transistors 1200-1206 are connected in parallel between the source of NMOS 804 and a ground terminal. Switches 1208-1214 are placed between the source of NMOS 804 and the transistors 1200-1206 as shown, to allow transistors 1200-1206 to be selectively engaged. In operation, the switches 1208-1214 are selectively closed to engage desired transistors 1200-1206, each of which can sink current and drop the voltage at the source of NMOS 804 by a predetermined amount (i.e., the known voltage drop across whichever ones of the transistors 1200-1206 are engaged, sized such as in a binary or incremental-by-one-unit value fashion). The transistors 1200-1206 can be chosen to provide differing voltage drops and thus differing trimming amounts, allowing switches 1208-1214 to be adaptively closed according to the amount of trimming desired.

Figure 3K:
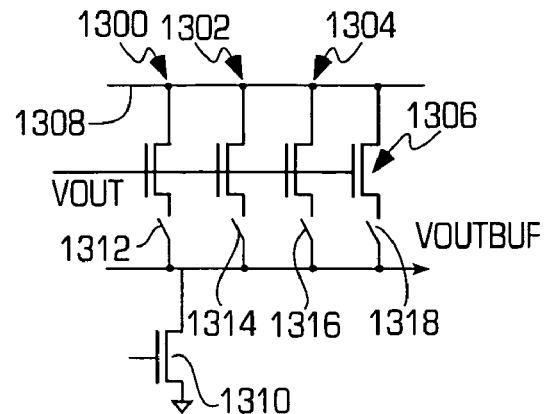

FIG. 3K illustrates another alternative trimming circuit consistent with one or more aspects of the present innovations. Here, the VOUT terminal is not connected to an NMOS 804. Instead, the VOUT terminal is connected to the gate terminals of transistors 1300-1306, which are in turn connected in parallel between a voltage source terminal 1308 and a VOUTBUF terminal providing output voltage to the comparator 203. Another transistor 1310 is connected between VOUTBUF and ground. Switches 1312-1318 are provided between the transistors 1300-1306 and VOUTBUF, and can be closed to selectively engage their corresponding transistors 1300-1306. Accordingly, when ones of the transistors 1300-1306 are engaged and a VOUT signal is applied to their gate terminals, engaged transistors 1300-1306, sized such as in a binary or incremental-by-one fashion, apply a voltage to the VOUTBUF line according to the magnitude of the voltage from voltage source terminal 1308 and the voltage drop across those transistors 1300-1306 that are engaged. The magnitude of the voltage from the voltage source terminal 1308, and the voltage drop across transistors 1300-1306, can thus be chosen so as to yield a VOUTBUF signal that is smaller than the VOUT signal, effectively resulting in a trimmed VOUT signal.

As above, it should be noted that trimming circuits consistent with the present innovations can be employed both alone and in conjunction with other circuits and systems of the invention. For instance, the trimming circuits of FIGS. 3H-3K can be employed alone, or along with one or more of the precharge circuit 600, clamp circuit 700, and buffer circuit 800 described above.

Figure 3L:
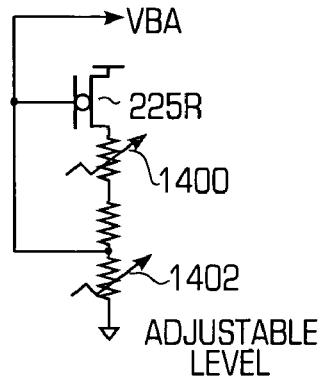
FIGS. 3L-3N are schematic diagrams illustrating further supply voltage compensation circuits configured in accordance with aspects of the present invention.

The compensation circuits of the invention can also employ adjustable-level resistors in various aspects consistent with the present innovations. More specifically, adjustable-level resistors can be used to provide varying loads in data columns 202, where the loads can be adjusted to compensate for variations in other parameters. For example, FIG. 3L illustrates a supply voltage compensation circuit in which the PMOS 225R (tuned element/transistor) connected to adjustable resistors 1400, 1402. The adjustable resistors 1400-1402 are connected in series between the drain terminal of PMOS 225R and the ground. In operation, the resistances of resistors 1400-1402 can be varied so as to provide a varying resistive load for the data columns 202. In particular, the resistance of resistors 1400-1402 can be varied, for example as a binary or incremental-by-one-unit value by CMOS switch muxing, so as to compensate for variations in VDD that change the voltage seen at the source of PMOS 225R. That is, the resistances of resistors 1400-1402 can be tuned so that the voltage drop across resistors 1400-1402 compensates for variations in the voltage at the source of PMOS 225R.

Figure 3M:
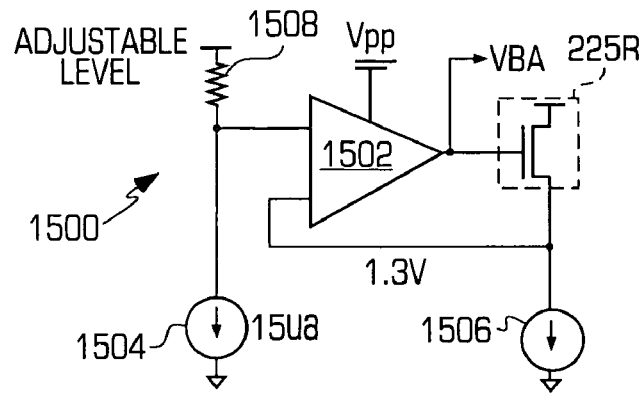

FIG. 3M illustrates another embodiment of a supply voltage compensation circuit employing adjustable-level resistors consistent with one or more aspects of the present innovations. Compensation circuit 1500 is similar to compensation circuit 500 of FIG. 3C, in that it includes an operational amplifier 1502 that is configured as a voltage follower for maintaining a constant drain-source voltage drop in NMOS 225N (instead of PMOS 225R, in this case NMOS is used instead of PMOS 225 in the sensing circuitry). Like compensation circuit 500, compensation circuit 1500 also includes current sources 1504-1506 for maintaining a constant current through the NMOS 225N and adjustable resistor 1508, thus yielding a constant load at the NMOS 225N and a constant voltage drop across the adjustable resistor 1508, respectively. In operation, the resistance of the resistor 1508 can be adjusted to achieve a desired voltage at the noninverting terminal of operational amplifier 1502, thus resulting in a constant voltage drop of a desired magnitude across NMOS 225N. Accordingly, the adjustable resistor 1508 can be employed to achieve a desired load at NMOS 225N, despite variations in VDD and/or other parameters. The adjustable resistor 1508 for instance is implemented as a binary or incremental-by-one-unit value by CMOS switch muxing.

Figure 3N:
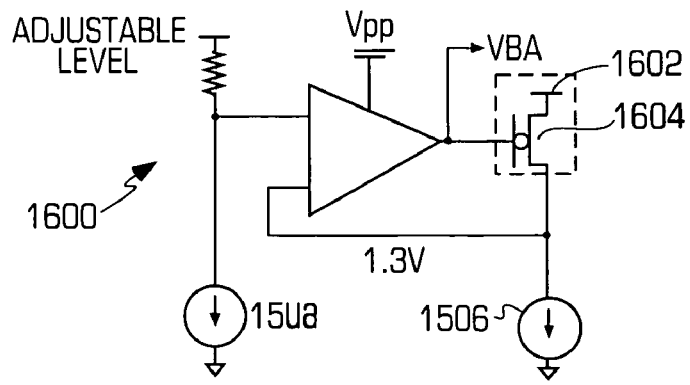

FIG. 3N illustrates further embodiments of a supply voltage compensation circuit employing adjustable-level resistors consistent with one or more aspects of the present innovations. More specifically, FIG. 3N illustrates that other types of transistors can be employed as load transistors besides PMOS 225R. The compensation circuit 1600 of FIG. 3N is similar to circuit 1500 of FIG. 3M, except that instead of PMOS 225R, transistor 1604 is used. Transistor 1604 can be any suitable transistor, but in particular it should be noted that the transistor 1604 can be an enhancement PMOS transistor, a native PMOS transistor, or a slightly depleted PMOS transistor. It is known that these different PMOS transistors each have different threshold voltages. Typically, enhancement PMOS transistors have threshold voltages on the order of −0.6 V, while native PMOS transistors have threshold voltages on the order of 0.0 V and slightly depleted PMOS transistors have threshold voltages on the order of −0.3 V. These different threshold voltages gives a wider operating range for the tuning node VBA.

Figure 4A:
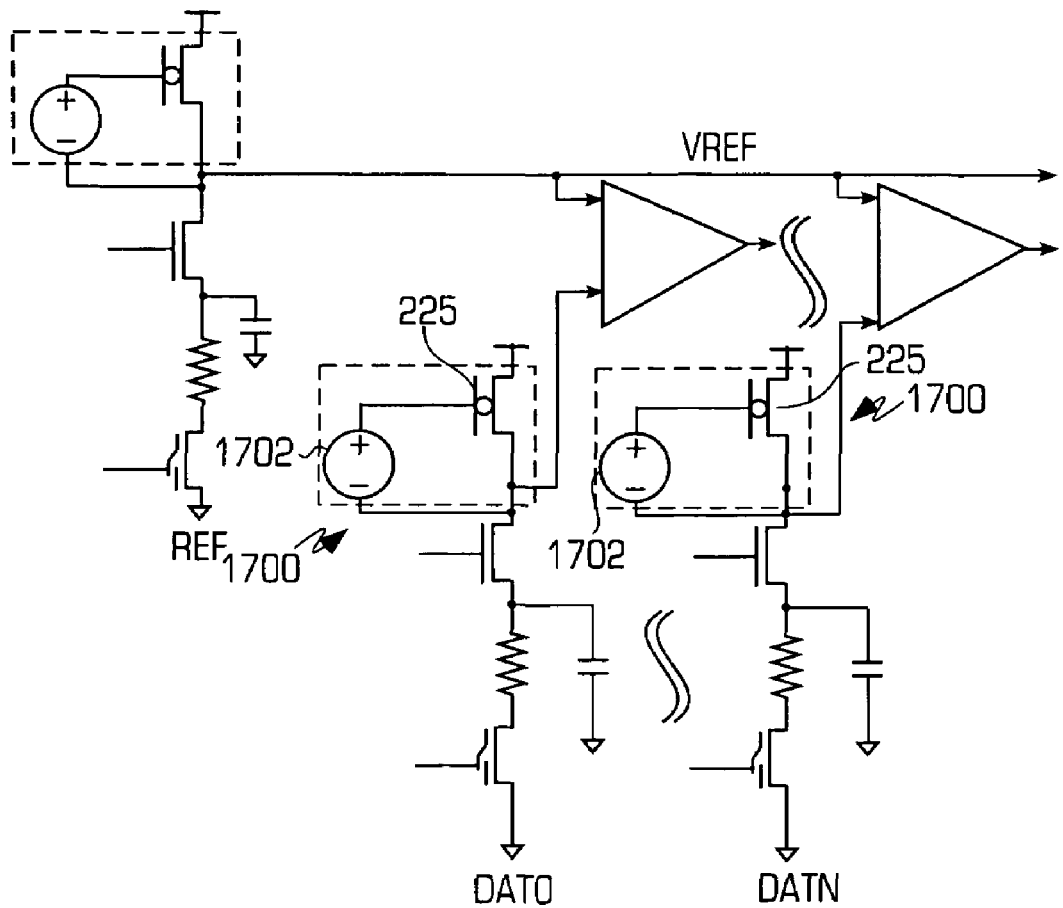
FIGS. 4A-4B are schematic diagrams of further supply voltage compensation circuits in which load transistors operate in their saturation regions, consistent with aspects of the present invention.
Figure 4B:
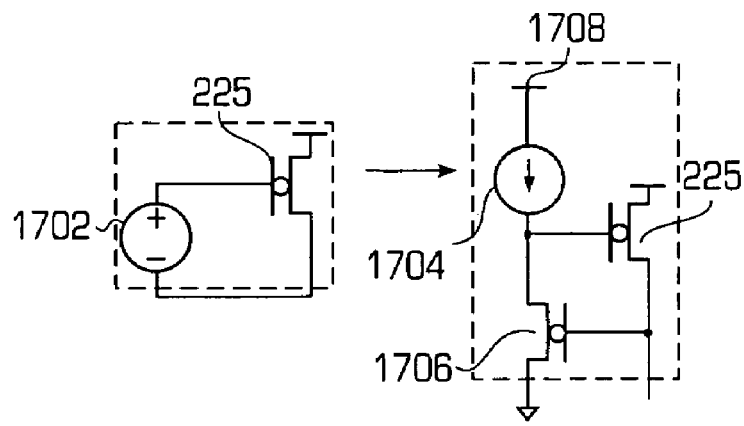

In addition to compensating for fluctuations in supply voltage, the present innovations encompass circuits configured to compensate for voltage variations that take the PMOS 225 (i.e., the load element of data columns 202) out of its saturation region. That is, the innovations may include circuits for maintaining load elements in their saturation region, i.e., operating in saturation mode. FIGS. 4A-4B are schematic diagrams and detailed diagrams, respectively, of further supply voltage compensation circuits in which load transistors operate in their saturation regions consistent with one or more aspects of the present innovations. Here, a compensation circuit 1700 maintains a gate-source voltage difference that keeps the PMOS 225 in its saturation region, so that current through the PMOS 225 does not vary, and a constant load is more readily maintained.

The compensation circuit 1700 can be as simple as a voltage source 1702 connected so as to maintain a specified voltage between the gate and drain of PMOS 225, as shown. While the invention encompasses the use of any suitable voltage source, one such configuration of voltage source 1702 is shown in FIG. 4B, where a current source 1704 and PMOS transistor 1706 are connected in series between a voltage source node 1708 and a ground terminal. The current source 1704 is connected between the voltage source node 1708 at one end, and the gate of PMOS 225 and the source terminal of PMOS 1706, at the other, as shown. The drain of PMOS 1706 is grounded, while the gate of PMOS 1706 is connected to the drain of PMOS 225. Configured in this manner, the current source 1704 forces current through PMOS 1706, maintaining the voltage at the gate of PMOS 225 at or above least the source-gate voltage difference of PMOS 1706. PMOS 1706 can therefore be selected so that its source-gate voltage difference keeps PMOS 225 in its saturation region.

Figure 5A:
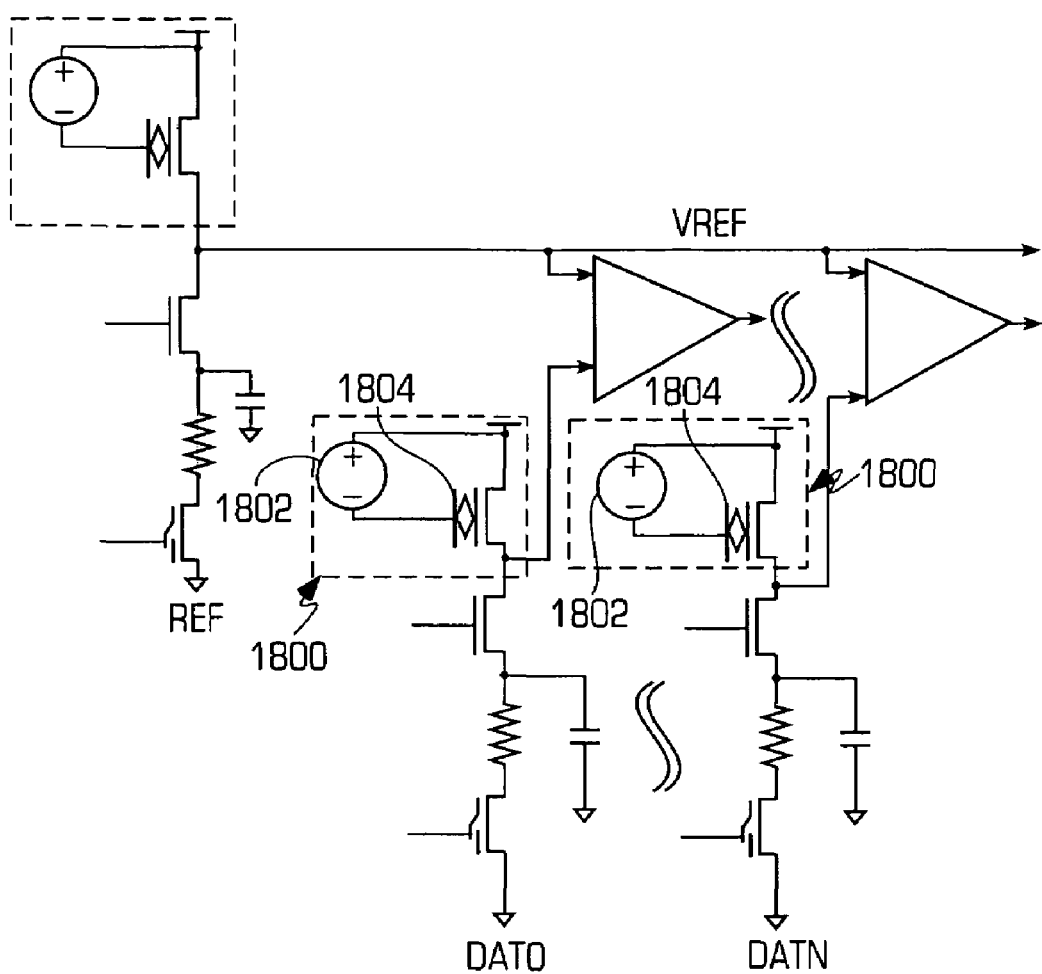
FIGS. 5A-5B are schematic diagrams of further supply voltage compensation circuits in which load transistors operate in their saturation regions, consistent with aspects of the present invention.
Figure 5B:
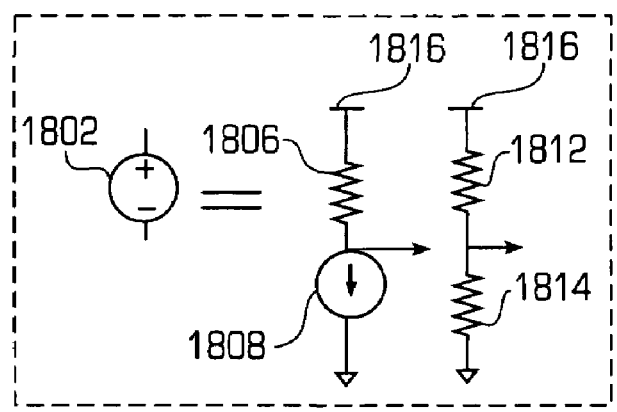

FIGS. 5A-5B illustrate another embodiment of compensation circuits for maintaining data column load elements in their saturation regions. Here, an NMOS transistor 1804 is employed as the load element rather than PMOS 225, and voltage source 1802 is connected between the drain and gate of NMOS 1804, instead of the gate and source. An NMOS transistor may be used here because it provides faster operation, though is subject to a body effect. As with the voltage source 1702 above, the invention encompasses the use of any suitable voltage source 1802 for maintaining a gate-drain voltage difference in NMOS 1804. FIG. 5B illustrates two examples of such a voltage source 1802. In the first example, the voltage source 1802 includes a resistor 1806 and current source 1808 connected in series between a voltage terminal 1810 (i.e., VDD) and a ground terminal. The current from current source 1808 forces a specified voltage drop across resistor 1806, placing a specified voltage at the output terminal (shown by the arrow) between resistor 1806 and current source 1808. In the second example, the voltage source 1802 includes a first resistor 1812 and second resistor 1814 connected in series between a voltage terminal 1816 (i.e., VDD) and a ground terminal. The resistances of resistors 1812, 1814 are selected so as to yield a specified voltage drop across resistor 1812 and thus a specified output voltage at the output terminal (shown by the arrow). In both examples, the output terminal is connected to the gate terminal of NMOS 1804, and applies its output voltage to that gate terminal.

Each configuration of voltage source 1802 maintains a specified gate-drain voltage difference in NMOS 1804, the magnitude of which can be selected to maintain the NMOS 1804 in its saturation region and thus a more constant load.

Figure 6A:
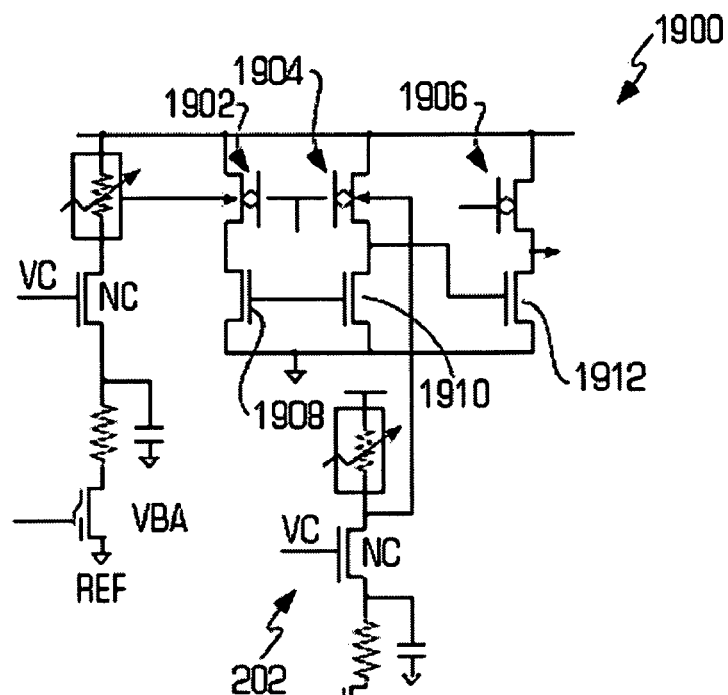
FIGS. 6A-6B are schematic diagrams illustrating comparator circuits employing body effects, in accordance with aspects of the present invention.
Figure 6B:
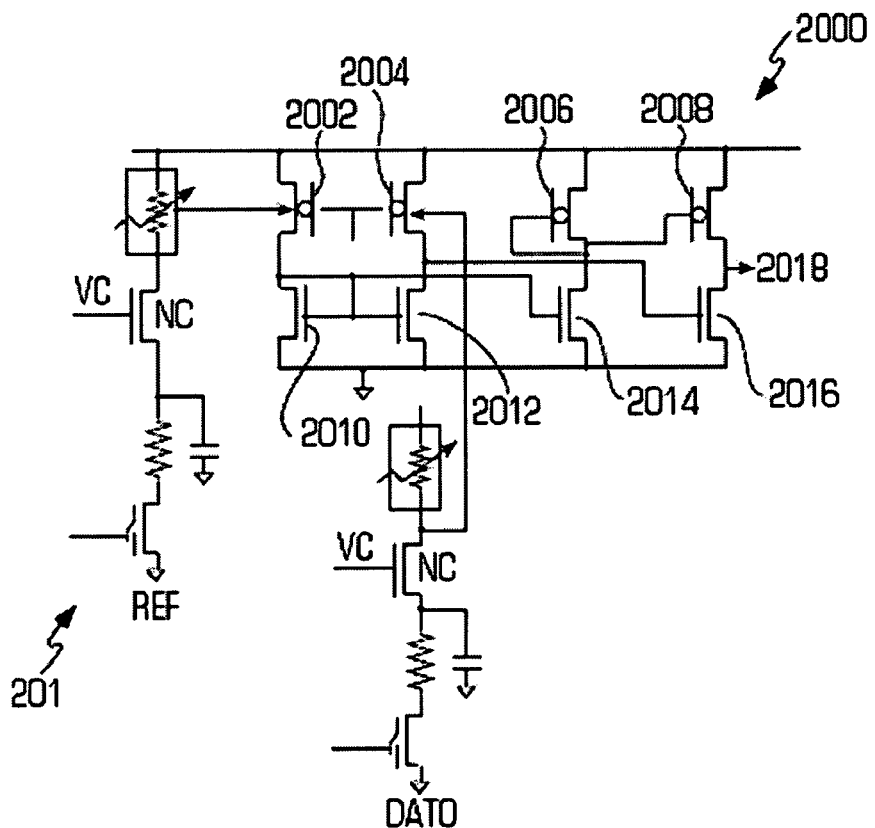

To further alleviate the problem of fluctuations in parameters such as VDD magnitude, the innovations here may also include comparator circuits that work at low VDD voltage values. FIGS. 6A-6B illustrate comparator circuits consistent with aspects of the present innovations that are designed to function at low VDD values, by employing transistors utilizing a body effect. In FIG. 6A, a comparator circuit 1900 includes PMOS transistors 1902-1906, each connected serially to one of transistors 1908-1912, respectively. The transistors 1908-1910 are configured as a current mirror, mirroring the same current through each PMOS 1902-1904 to a ground terminal. The transistors 1902-1904 and 1908-1910 constitutes a first gain stage. The first stage gain is equal to the ro*gmb, with gmb is the bulk transconductance of the transistor 1902 and 1904 and ro is equivalent parallel output resistance of the transistor 1910 and 1904. The transistor 1912 is configured as a common source amplifier with the transistor 1906 as a load. The transistor 1912 and 1906 constitutes a second gain stage. The second stage gain is equal to the ro2*gm, with gm is the gate transconductance of the transistor 1906 and 1912 and ro2 is equivalent parallel output resistance of the transistor 1906 and 1912. The PMOS transistors 1902-1906 are each connected at one end to the VDD line, and at the other to a corresponding transistor 1908-1912. The output voltage line from the reference column 201 is input to the bulk terminal of PMOS 1902, while the output voltage line from the data column 202 is input to the bulk terminal of PMOS 1904. The voltage at the drain of PMOS 1906 is provided as the output of the comparator circuit 1900. In operation, voltage signals from the reference column 201 and data column 202 are applied to the bulk terminals of PMOS transistors 1902-1904, changing their bulk transconductances, and therefore their gains, according to the known body effect. As the same current is mirrored through each transistor 1908-1912, differing voltages applied at the bulk terminals of PMOS transistors 1902-1904 thus result in a differing voltage appearing at the output of the first stage and amplified further by the second stage. Accordingly, comparator 1900 produces a voltage signal that varies according to the difference in gains of the first and second stages. In effect the sensing circuitry provides a voltage output basing on the bulk transconductance differences basing on the reference memory output level and the data memory output level.

The invention includes other comparator configurations, as well. In FIG. 6B, a comparator circuit 2000 consistent with aspects of the present innovations includes four PMOS transistors 2002-2008 and additional transistors 2010-2016. The transistors 2010-2014 are configured as current mirrors, and PMOS transistors 2002-2008 are connected each between the VDD line at their source terminal, and a corresponding transistor 2010-2016 at their drain terminal. The opposite terminals of the transistors 2010-2016 are grounded, as shown. The transistors 2002-2004 and 2010-2012 are similarly to transistor 1902-1904 and 1908-1910 of FIG. 6A. The transistor 2016 is similar to transistor 1912 of FIG. 6A. The PMOS 2006 and 2008 are configured as a current mirror and loading to transistor 2014 and 1016 respectively. The output voltage line from the reference column 201 is input to the bulk terminal of PMOS 2002, while the output voltage line from the data column 202 is input to the bulk terminal of PMOS 2004. The voltage at the source of PMOS 2008 is provided as the output of the comparator circuit 2000. In operation then, the gains of PMOS transistors 2002-2004 will differ with differing output voltages applied to their bulk terminals, resulting in a voltage at output node 2018 that varies according to the difference in these output voltages.

It should be noted that the invention includes the use of the above described comparator circuits 1900, 2000 alone, and in conjunction with any one or more of the above described circuits, such as the precharge circuit 600, the clamp circuit 700, and/or the buffer circuit 800.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Many modifications and variations are possible in view of the above teachings. For instance, the above described compensation circuits can compensate for variations in many different parameters, including variations in VDD magnitude, temperature, and fabrication process, to produce a fixed magnitude load. Similarly, the above described compensation circuits can be utilized alone, or in conjunction with any one or more of the above described precharge circuits, buffer circuits, clamp circuits, or comparator circuits. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A multilevel memory system configured to detect a voltage level stored in a multilevel memory cell, comprising:
 a memory sensing circuit connected to the multilevel memory cell and having a voltage supply terminal,
 a load element connected between the voltage supply terminal and the multilevel memory cell, the load element providing a load for the memory sensing circuit as a function of a voltage drop across at least a portion of the load element and a current through the load element; and
 a load compensation circuit connected to the load element and configured to maintain the load by compensating for a load variation of the load;
 wherein the load element includes a PMOS transistor;
 wherein the load compensation circuit is configured as a voltage follower circuit configured to maintain the load by maintaining a voltage drop across a portion of the PMOS transistor; and
 wherein the voltage follower circuit comprises:
  an operational amplifier having a non inverting terminal, an inverting terminal, and an output terminal, the output terminal connected to a gate terminal of the PMOS transistor, and the noninverting terminal connected to a drain terminal of the PMOS transistor, so as to maintain the voltage drop between the drain terminal of the PMOS transistor and the source terminal of the PMOS transistor;
  a voltage source configured to maintain a voltage at the inverting terminal; and
  a current source configured to maintain a current through the PMOS transistor.

2. The system of claim 1 wherein the load element includes an enhancement PMOS transistor, a native PMOS transistor, a slightly depleted PMOS transistor, or a MOS transistor.

3. The system of claim 1 wherein the load variation is a load variation due to at least one of a variation in a magnitude of a voltage applied at the voltage supply terminal, a variation in a temperature of the load element, or a variation in a fabrication of the load element.

4. The system of claim 1 wherein the load compensation circuit is further configured to maintain the load at a predetermined value.

5. The system of claim 1 wherein the memory system is non-volatile.

6. A multilevel memory system configured to detect a voltage level stored in a multilevel memory cell, comprising:
 a memory sensing circuit connected to the multilevel memory cell and having a voltage supply terminal,
 a load element connected between the voltage supply terminal and the multilevel memory cell, the load element providing a load for the memory sensing circuit as a function of a voltage drop across at least a portion of the load element and a current through the load element; and
 a load compensation circuit connected to the load element and configured to maintain the load by compensating for a load variation of the load;
 wherein the load element includes a PMOS transistor;
 wherein the load compensation circuit is configured as a voltage follower circuit configured to maintain the load by maintaining a voltage drop across a portion of the PMOS transistor; and
 wherein the voltage follower circuit comprises:
  an operational amplifier having a noninverting terminal, an inverting terminal, and an output terminal, the output terminal connected to a gate terminal of the PMOS transistor, and the noninverting terminal connected to a drain terminal of the PMOS transistor, so as to maintain the voltage drop between the drain terminal of the PMOS transistor and the source terminal of the PMOS transistor;

a resistor connected between a voltage source terminal and the inverting terminal of the operational amplifier; and a current mirror connected between the inverting terminal of the operational amplifier and the drain terminal of the PMOS transistor, and configured to mirror the current through the PMOS transistor as a second current through the resistor.

7. The system of claim 6 wherein the load element includes an enhancement PMOS transistor, a native PMOS transistor, a slightly depleted PMOS transistor, or a MOS transistor.

8. The system of claim 6 wherein the load variation is a load variation due to at least one of a variation in a magnitude of a voltage applied at the voltage supply terminal, a variation in a temperature of the load element, or a variation in a fabrication of the load element.

9. The system of claim 6 wherein the load compensation circuit is further configured to maintain the load at a predetermined value.

10. The system of claim 6 wherein the memory system is non-volatile.

11. A multilevel memory system configured to detect a voltage level stored in a multilevel memory cell, comprising:
    a memory sensing circuit connected to the multilevel memory cell and having a voltage supply terminal,
    a load element connected between the voltage supply terminal and the multilevel memory cell, the load element providing a load for the memory sensing circuit as a function of a voltage drop across at least a portion of the load element and a current through the load element; and
    a load compensation circuit connected to the load element and configured to maintain the load by compensating for a load variation of the load;
    wherein the load element includes a PMOS transistor;
    wherein the load compensation circuit is configured as a voltage follower circuit configured to maintain the load by maintaining a voltage drop across a portion of the PMOS transistor; and
    wherein the voltage follower circuit further comprises:
        an operational amplifier having a noninverting terminal, an inverting terminal, and an output terminal, the output terminal connected to a gate terminal of the PMOS transistor, and the noninverting terminal connected to a drain terminal of the PMOS transistor, so as to maintain the voltage drop between the drain terminal of the PMOS transistor and the source terminal of the PMOS transistor;
        a resistor connected between a voltage source terminal and the inverting terminal of the operational amplifier;
        a first current source configured to transmit the current through the PMOS transistor; and
        a second current source configured to transmit a second current through the resistor, the second current having a magnitude approximately equal to a magnitude of the current through the PMOS transistor.

12. The system of claim 11 wherein the resistor has an adjustable resistance, the resistor configured to compensate for the load variation by adjusting a voltage at the inverting terminal according to the adjustable resistance.

13. The system of claim 11 wherein the load element includes an enhancement PMOS transistor, a native PMOS transistor, a slightly depleted PMOS transistor, or a MOS transistor.

14. The system of claim 11 wherein the load variation is a load variation due to at least one of a variation in a magnitude of a voltage applied at the voltage supply terminal, a variation in a temperature of the load element, or a variation in a fabrication of the load element.

15. The system of claim 11 wherein the load compensation circuit is further configured to maintain the load at a predetermined value.

16. A multilevel memory system configured to detect a voltage level stored in a multilevel memory cell, comprising:
    a memory sensing circuit connected to the multilevel memory cell and having a voltage supply terminal,
    a load element connected between the voltage supply terminal and the multilevel memory cell, the load element providing a load for the memory sensing circuit as a function of a voltage drop across at least a portion of the load element and a current through the load element;
    a load compensation circuit connected to the load element and configured to maintain the load by compensating for a load variation of the load; and
    a precharge circuit in electrical communication with the memory sensing circuit, the precharge circuit configured to transmit a precharge to the memory sensing circuit so as to reduce a settle time of the memory sensing circuit.

17. The system of claim 16 wherein the precharge circuit further comprises a plurality of resistors configured in electrical series so as to transmit the precharge according to a ratio of the resistances of the resistors.

18. The system of claim 16 wherein the load element includes an enhancement PMOS transistor.

19. The system of claim 16 wherein the load element includes a native PMOS transistor.

20. The system of claim 16 wherein the load element includes a slightly depleted PMOS transistor.

21. The system of claim 16 wherein the load variation is a load variation due to at least one of a variation in a magnitude of a voltage applied at the voltage supply terminal, a variation in a temperature of the load element, or a variation in a fabrication of the load element.

22. The system of claim 16 wherein the load compensation circuit is further configured to maintain the load at a predetermined value.

23. The system of claim 16 wherein the load element includes a PMOS transistor.

24. The system of claim 23 wherein the load compensation circuit is configured as a voltage follower circuit configured to maintain the load by maintaining a voltage drop across a portion of the PMOS transistor.

25. The system of claim 16 wherein the memory system is non-volatile.

26. A multilevel memory system configured to detect a voltage level stored in a multilevel memory cell, comprising:
    a memory sensing circuit connected to the multilevel memory cell and having a voltage supply terminal,
    a load element connected between the voltage supply terminal and the multilevel memory cell, the load element providing a load for the memory sensing circuit as a function of a voltage drop across at least a portion of the load element and a current through the load element;
    a load compensation circuit connected to the load element and configured to maintain the load by compensating for a load variation of the load; and
    a clamp circuit in electrical communication with the memory sensing circuit, the clamp circuit configured to apply a clamp voltage to the memory sensing circuit so as to maintain a voltage within the memory sensing circuit.

27. The system of claim 26 wherein the clamp circuit further includes a voltage source terminal and a PMOS transistor coupled between the voltage source terminal and the multilevel memory cell.

28. The system of claim 26 wherein the memory sensing circuit is configured to generate an output voltage signal corresponding to data stored in the multilevel memory cell, the output voltage having an associated noise, the system further comprising:
a buffer circuit having an input terminal connected to the memory sensing circuit and configured to receive the output voltage signal, and having an output terminal, the buffer circuit configured to decouple the output voltage signal from the associated noise so as to form a decoupled output voltage signal, and configured to transmit the decoupled output voltage signal at the output terminal.

29. The system of claim 28 wherein the buffer circuit further includes a voltage source terminal and a native NMOS transistor having a gate terminal connected to the input terminal, a drain terminal connected to the voltage source terminal, and a source terminal connected to the output terminal.

30. The system of claim 29 wherein the buffer circuit further includes a trimming circuit in electrical communication with the output terminal, the trimming circuit configured to trim the decoupled output voltage signal.

31. The system of claim 30 wherein the trimming circuit includes a trimming circuit transistor having a drain terminal in electrical communication with the output terminal and having a grounded source terminal.

32. The system of claim 31 wherein the trimming circuit further includes at least one resistor connected between the output terminal and a ground terminal.

33. The system of claim 31 wherein the trimming circuit further includes at least one resistor connected between the output terminal and the trimming circuit transistor.

34. The system of claim 31 wherein the trimming circuit further includes a plurality of trimming circuit transistors each having a drain terminal in electrical communication with the output terminal and having a grounded source terminal.

35. The system of claim 28:
wherein the buffer circuit further includes a voltage source terminal and a plurality of buffer circuit transistors each having a gate terminal connected to the input terminal, a drain terminal connected to the voltage source terminal, and a source terminal connected to the output terminal; and
wherein the buffer circuit further includes a trimming transistor having a drain terminal in electrical communication with the output terminal and having a grounded source terminal, the trimming transistor configured to trim the decoupled output voltage signal.

36. The system of claim 26 wherein the clamp circuit further includes a voltage source terminal and an NMOS transistor coupled between the voltage source terminal and the multilevel memory cell.

37. The system of claim 26 wherein the load element includes an enhancement PMOS transistor.

38. The system of claim 26 wherein the load element includes a native PMOS transistor.

39. The system of claim 26 wherein the load element includes a slightly depleted PMOS transistor.

40. The system of claim 26 wherein the load variation is a load variation due to at least one of a variation in a magnitude of a voltage applied at the voltage supply terminal, a variation in a temperature of the load element, or a variation in a fabrication of the load element.

41. The system of claim 26 wherein the load compensation circuit is further configured to maintain the load at a predetermined value.

42. The system of claim 26 wherein the load element includes a PMOS transistor.

43. The system of claim 42 wherein the load compensation circuit is configured as a voltage follower circuit configured to maintain the load by maintaining a voltage drop across a portion of the PMOS transistor.

44. The system of claim 26 wherein the memory system is non-volatile.

45. A multilevel memory system configured to detect a voltage level stored in a multilevel memory cell, comprising:
a memory sensing circuit connected to the multilevel memory cell and having a voltage supply terminal,
a load element connected between the voltage supply terminal and the multilevel memory cell, the load element providing a load for the memory sensing circuit as a function of a voltage drop across at least a portion of the load element and a current through the load element; and
a load compensation circuit connected to the load element and configured to maintain the load by compensating for a load variation of the load;
wherein the load compensation circuit further comprises at least one resistor having an adjustable resistance, the at least one resistor connected to a tuned element so as to compensate for the load variation by adjusting the current through the load element according to the adjustable resistance.

46. The system of claim 45 wherein the load element includes an enhancement PMOS transistor.

47. The system of claim 45 wherein the load element includes a native PMOS transistor.

48. The system of claim 45 wherein the load element includes a slightly depleted PMOS transistor.

49. The system of claim 45 wherein the load variation is a load variation due to at least one of a variation in a magnitude of a voltage applied at the voltage supply terminal, a variation in a temperature of the load element, or a variation in a fabrication of the load element.

50. The system of claim 45 wherein the load compensation circuit is further configured to maintain the load at a predetermined value.

51. The system of claim 45 wherein the load element includes a PMOS transistor.

52. The system of claim 51 wherein the load compensation circuit is configured as a voltage follower circuit configured to maintain the load by maintaining a voltage drop across a portion of the PMOS transistor.

53. The system of claim 45 wherein the memory system is non-volatile.

54. A multilevel memory system configured to detect a voltage level stored in a multilevel memory cell, comprising:
a memory sensing circuit connected to the multilevel memory cell and having a voltage supply terminal,
a load element connected between the voltage supply terminal and the multilevel memory cell, the load element providing a load for the memory sensing circuit as a function of a voltage drop across at least a portion of the load element and a current through the load element; and
a load compensation circuit connected to the load element and configured to maintain the load by compensating for a load variation of the load;
wherein the load element includes a first transistor having a drain terminal and a gate terminal, the transistor configured to operate in a saturation mode according to a voltage applied between the drain terminal and the gate terminal, and wherein the load compensation circuit further comprises a voltage source connected between the gate terminal and the drain terminal and configured to apply the voltage between the gate terminal and the drain terminal so as to render the first transistor operable in the saturation mode.

55. The system of claim 54 wherein the voltage source further comprises:
   a second transistor having a gate terminal connected to the drain terminal of the first transistor, and a source terminal connected to the gate terminal of the first terminal, and a grounded drain terminal; and
   a current source connected to the source terminal.

56. The system of claim 54 wherein the voltage source further comprises a resistor and a current source in electrical series, the resistor connected between the drain terminal and the gate terminal, and the current source connected between the gate terminal and a ground terminal.

57. The system of claim 54 wherein the voltage source further comprises a first resistor and a second resistor in electrical series, the first resistor connected between the drain terminal and the gate terminal, and the second resistor connected between the gate terminal and a ground terminal.

58. The system of claim 54 wherein the load element includes an enhancement PMOS transistor.

59. The system of claim 54 wherein the load element includes a native PMOS transistor.

60. The system of claim 54 wherein the load element includes a slightly depleted PMOS transistor.

61. The system of claim 54 wherein the load variation is a load variation due to at least one of a variation in a magnitude of a voltage applied at the voltage supply terminal, a variation in a temperature of the load element, or a variation in a fabrication of the load element.

62. The system of claim 54 wherein the load compensation circuit is further configured to maintain the load at a predetermined value.

63. The system of claim 54 wherein the load element includes a PMOS transistor.

64. The system of claim 63 wherein the load compensation circuit is configured as a voltage follower circuit configured to maintain the load by maintaining a voltage drop across a portion of the PMOS transistor.

65. The system of claim 54 wherein the memory system is non-volatile.

* * * * *